US012638767B2

(12) United States Patent
Chuang et al.

(10) Patent No.: US 12,638,767 B2
(45) Date of Patent: May 26, 2026

(54) CONTAINER FOR ACCOMMODATING SUBSTRATE WITH EFFECTIVE HERMETIC SEALING

(71) Applicant: GUDENG PRECISION INDUSTRIAL CO., LTD., New Taipei (TW)

(72) Inventors: Chia-Ho Chuang, New Taipei (TW);
Hsin-Min Hsueh, New Taipei (TW);
Yi-Hsuan Lee, New Taipei (TW);
Hsing-Min Wen, New Taipei (TW);
Shu-Hung Lin, New Taipei (TW);
Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 127 days.

(21) Appl. No.: 17/146,670

(22) Filed: Jan. 12, 2021

(65) Prior Publication Data

US 2021/0356858 A1 Nov. 18, 2021

Related U.S. Application Data

(60) Provisional application No. 63/024,595, filed on May 14, 2020.

(51) Int. Cl.
G03F 1/66 (2012.01)
B65D 81/24 (2006.01)
(Continued)

(52) U.S. Cl.
CPC ............... G03F 1/66 (2013.01); B65D 81/24 (2013.01); B65D 85/30 (2013.01); G03F 1/22 (2013.01);
(Continued)

(58) Field of Classification Search
CPC ........... G03F 1/66; B65D 81/24; B65D 85/30; H01L 21/67353; H01L 21/67359;
(Continued)

(56) References Cited

U.S. PATENT DOCUMENTS 5,956,576 A * 9/1999 Toy .......................... H01L 23/10
438/122
8,552,725 B2 * 10/2013 Abbink .................. G01C 19/60
324/318
(Continued)

FOREIGN PATENT DOCUMENTS

JP 2005255234 A 9/2005

*Primary Examiner* — Orlando E Aviles
*Assistant Examiner* — Jenine Spicer
(74) *Attorney, Agent, or Firm* — Troutman Pepper Locke LLP; Tim Tingkang Xia, Esq.

(57) ABSTRACT

The invention discloses a container for accommodating a substrate. The container includes a base having at least one first supporting surface and a lid having at least one second supporting surface to engage with the first supporting surface of the base, so as to define an accommodating space for the substrate. The first supporting surface of the base and the second supporting surface of the lid have the same slope with a respective flatness of 0.04 mm or less, so that an effective hermetic seal between the first supporting surface and the second supporting surface is formed when the two surfaces contact each other.

34 Claims, 13 Drawing Sheets

(51) Int. Cl.

| | |
|---|---|
| *B65D 85/30* | (2006.01) |
| *G03F 1/22* | (2012.01) |
| *G03F 7/00* | (2006.01) |
| *G06K 7/14* | (2006.01) |
| *H01L 21/67* | (2006.01) |
| *H01L 21/673* | (2006.01) |
| *H10P 72/00* | (2026.01) |
| *H10P 72/10* | (2026.01) |

(52) U.S. Cl.
   CPC ........... *G03F 7/70741* (2013.01); *G06K 7/14* (2013.01); *H10P 72/0618* (2026.01); *H10P 72/1902* (2026.01); *H10P 72/1906* (2026.01); *H10P 72/1911* (2026.01); *H10P 72/1916* (2026.01); *H10P 72/1922* (2026.01)

(58) Field of Classification Search
   CPC ......... H01L 21/67366; H01L 21/67376; H01L 21/67386
   See application file for complete search history.

(56) References Cited

U.S. PATENT DOCUMENTS

| | | | |
|---|---|---|---|
| 2006/0260978 A1* | 11/2006 | Gregerson | G03F 7/70741 206/710 |
| 2008/0024751 A1 | 1/2008 | Hirayanagi | |
| 2009/0301917 A1 | 12/2009 | Kolbow et al. | |
| 2017/0366161 A1* | 12/2017 | Kawai | H03H 9/0519 |
| 2018/0210349 A1 | 7/2018 | Hsueh et al. | |

* cited by examiner

CONTAINER FOR ACCOMMODATING SUBSTRATE WITH EFFECTIVE HERMETIC SEALING

CROSS-REFERENCE TO RELATED PATENT APPLICATION

This non-provisional application claims priority to and the benefit of, pursuant to 35 U.S.C. § 119(e), U.S. provisional patent application Ser. No. 63/024,595 filed May 14, 2020. The disclosure of the above application is incorporated herein in its entirety by reference.

FIELD OF THE INVENTION

The present disclosure relates to a transport pod employed to transport patterned substrates, more particularly to a two-nesting container employed to transport reticles, including a reticle pod that can provide effective hermetic sealing, precise marking, and stable retention.

DESCRIPTION OF THE PRIOR ART

Substrates required for semiconductor manufacturing (such as substrates for wafers and reticles) are accommodated in special containers during transportation, with an aim to prevent the substrates from being contaminated by pollutants, such as air particles, in non-vacuum environments during transportation, causing defects in semiconductor manufacturing processes.

FIG. 1 shows a prior art EUV reticle pod, which comprises an inner pod assembly 110 and an outer pod assembly 150. The inner pod assembly 110 is employed to accommodate a reticle (R) and comprises a lower lid 120 and an upper lid 130. The lower lid 120 comprises four supporting members 121 to support the reticle R. The upper lid 130 is coupled to the lower lid 120 and includes four pressing units 140, which correspond to the four supporting members 121, to press against the surface of the reticle R. The pressing unit 140 comprises a pressing member, which includes a press force receiving portion and a pressing portion. In particular, the press force receiving portion is exposed at the top surface of the upper lid 130 to receive a downward-pressing pins 171 on an outer lid 170 of the outer pod assembly 150. After the press force receiving portion is pressed downward, the pressing portion will protrude from the bottom surface of the upper lid 130 to press against the surface of the reticle R. The outer pod assembly 150 is used to accommodate the inner pod assembly 110, and comprises a base 160 and an outer lid 170. The base 160 has multiple pillars 190 to support the lower lid 120 of the inner pod assembly 110; the base 160 is also coupled to the outer lid 170 to form a hermetic seal with it. The outer lid 170 has four downward-pressing pins 171 on the inside of its bottom surface. The four downward-pressing pins 171 correspond to the four pressing units 140, and each is used to contact the surface of the press force receiving portion on the pressing member of each pressing unit 140. When the inner pod assembly 110 that stores the reticle (R) is accommodated within the outer pod assembly 150, the downward-pressing pins 171 will apply forces to the press force receiving portions on the pressing members of the pressing units 140, thereby allowing the pressing units 140 and the supporting members 121 to keep the reticle (R) in stable retention.

The inner pod assembly 110 of the prior art EUV reticle pod 100 has the following technical problems to overcome. Firstly, the pressing member of each pressing unit 140 is exposed at the top surface of the upper lid 130 and can protrude from the bottom surface of the upper lid 130, giving a risk that particles may fall on the upper lid 130 and pass through the space accommodating the pressing member. Particles may eventually enter the inner cavity to pollute the reticle (R). Secondly, when the inner pod assembly 110 that accommodates the reticle (R) is not placed within the outer pod assembly 150, the pressing portions of the pressing members on the four pressing units of the upper lid 130 do not protrude from the bottom surface of the upper lid 130. At this point, the reticle (R) is not securely retained by the pressing units 140 and the supporting members 121, which thereby increases the risk of more particles resulting from any misplacement or shock of the reticle (R). Thirdly, when the inner pod component 110 that accommodates the reticle (R) is placed at the base 160 of the outer pod component 150, the outer lid 170 may, when being pressed downward, cause the press pins 171 to collide with the reticle (R) more easily through the clamping unit 140, thereby increasing the risk of more particles resulting from any displacement or shock of the reticle R.

Of the prior art, Taiwan Patent Publication No. 200304051 discloses a two-part container for accommodating reticles. Such a container consists of an outer pod and an inner pod; the inner pod is placed within the outer pod, and the reticle is placed within the inner pod. In most cases, reticles are made in a highly vacuumed environment, and thus, a container accommodating a reticle may transition between a vacuumed environment or an atmospheric pressure environment during transportation. Alternatively, the container may be transported to the atmospheric pressure environment after being vacuumed. In order to keep a pressure difference between the inside and outside of the container from causing an airflow to blow particles into the inner cavity where the reticle is placed, a filter channel is provided between the inner cavity and the outer space to filter particles. As a result, the hermetic sealing between the inner cavity and outer space of the container other than the filter passage ensures that the pressure difference between the inside and outside of the container do not cause an airflow to pass through the area other than the filter channel and sweep particles into the area where the reticle is placed. The above-described patent publication discloses a sealing means that provides a particle sealing device (such as an O-ring) between the inner pod and the outer pod, and a gas sealing device (such as another O-ring) on a contact interface between the lid of the outer pod and the base. These configurations become enhanced barriers preventing pollutants from coming into the reticle area in a vacuum environment. The same patent publication discloses that the inner pod comprises a pod lid and a base, which together define an accommodating space for the reticle, but there is not an O-ring provided on a contact interface between the inner pod lid and the base. In other words, sealing of the inner pod merely depends on the contact interface between the pod lid and the base, and yet, the publication does not disclose or teach how to define or control the contact interface to achieve effective sealing.

Taiwan Patent No. 1391304, titled "Reticle Pod," states that a prior art seal is often made of an elastomeric material which itself may be a source of particulates or a source of contamination. Moreover, the patent mentions that in prior art, forming a seal using an elastomeric seal requires the use of certain structures (such as grooves and raised bumps). Although such structures are widely used, they may have the drawback of causing particulate pollutants or chemicals to be retained in the interstices. The patent proposes a structure to form flat surfaces near the perimeter of the door and the cover respectively; upon mating the cover with the door, the flat surfaces abut on each other to create a seal to prevent particulates from entering the interior of the pod from an environment external to the pod, thereby eliminating the need for a traditional elastomer seal. The patent teaches that the surface for sealing has a surface finish with a roughness average (Ra) of up to 0.50 micro inches, which is acceptable, yet a preferred range would be from 0.20 to 0.40 Ra.

However, based on the common general knowledge that a person skilled in the art is familiar with, the roughness average (Ra) applied to define the roughness of a surface finish, as mentioned in said patent, should be "an expression indicating a surface roughness obtained by calculating a mean absolute deviation based on a center line of the roughness curve," and "the average value of the deviations from the center line to the measurement points within a certain length of the sample, as demonstrated in FIG. 8-3-1," as specified on page 212 of "Precision Measurement," first published on Nov. 10, 1998, and authored/compiled by Fan Kuang-chao and Chang Kuo-yi. FIG. 2 of this application shows the above-described FIG. 8-3-1 taken from the book. When the cover and the door of the reticle pod are engaged, whether the upper and lower surfaces that lie flush against each other can achieve hermetic sealing, in fact, depends on the interstice between the upper and lower surfaces. In the above-described patent, the "roughness average (Ra)" is applied to assess the roughness of a surface finish, and yet it indicates the surface roughness based merely on a linear segment length. Said roughness average (Ra) can barely be used to assess the roughness of an interstice between the upper and lower surfaces of the respective cover and door, as those surfaces lie flush against each other in a large area. In other words, the roughness average (Ra) of a surface finish disclosed in said patent to assess whether the upper and lower surfaces of the engaged cover and door of a reticle pod achieve hermetic sealing is not a good indicator.

The above-mentioned book "Precision Measurement" discusses factors that define surface texture, and states that no matter how precise the surface of a workpiece is machined, there must be certain difference between the finished surface and the ideal surface. Reasons behind the unavoidable difference include: low-frequency waviness caused by low-frequency vibrations, machine chatter, and machine/workpiece deflections and so on, as a result of machining; and irregular surfaces with high-frequency roughness caused factors such as turning, milling, grinding, sandblasting, flames, and so on, as a result of machining. The degree of roughness is expressed as the curved wave being the centerline (a straight line). The described center-line Ra is using the center line of the Ra curve as the baseline to calculate the average of the absolute values of the roughness deviations. Therefore, the value of Ra is unable to reflect the maximum value of the roughness deviation, and it is smaller than the magnitude of the waviness. Therefore, a person skilled in the art would have known, given the fact that a workpiece surface cannot avoid impacts from low-frequency and high-frequency factors due to actual processing, the workpiece surface must have included waviness and Ra. Thus, in terms of determining whether an effective hermetic sealing is formed between the surfaces of two workpieces, the prior art merely discloses using the Ra value, which is lower than the waviness magnitude, to assess the "sealing surface," but the Ra value is not sufficient to ensure effective sealing.

It is known that the base and lid of a reticle pod are made of metal. While grinding or polishing may improve the surface finish of a metal surface (or a surface treated with electroless nickel plating), the product yield of reticle pods (in terms of effective hermetic sealing) having surfaces with 0.5 Ra, or even with 0.20-0.40 Ra produced using existing grinding or polishing technologies is unlikely to improve, and the cost for production equipment will increase sharply. Furthermore, as stated above, apparently, it is unable to ensure the effect of the hermetic sealing if only the Ra value is used as one of the design goals to achieve a sealing surface.

In addition, a reticle pod is directionally oriented when opened for use. Thus, when a reticle pod is sent into a lithography machine, detection of not only the position, but also the orientation of the reticle pod is required to avoid deviation in the exposure location during the lithography process. Therefore, to ensure precise alignment of the reticle pod position, the lithography machine will send a light signal to the surface of the reticle pod, and then a sensor will obtain a reflected signal of the light signal for identification. In prior art, a sensor may, due to the smooth surface or bottom structure design of a reticle pod, fail to obtain reflected signals stably and thereby unable to identify accurately whether the feature area of the reticle pod is in the right position. A prior art technique uses a cross-line reticle to mark the surface of the reticle pod. However, when the light signal sent by the lithography machine falls on the 3D structure of the pod surface in a specific angle, it will be difficult to identify where the cross-line reticle is relative to the 3D structure surface based on the reflected signal detected by the sensor.

Thus, in a bid to address the various technical problems stated above, the present invention provides a reticle storage pod and a reticle transport pod with features including effective hermetic sealing, precise marking and stable retention.

SUMMARY OF THE INVENTION

The present invention aims to fulfill a hermetical seal by control of the "flatness" of a contacting interface between a lid and a base of a reticle container. A research according to inventors points out the prior art only improving the average surface roughness (Ra) in the contact interface between the base and the lid cannot guarantee a seal between the lid and the base when they contact with each other. The inventors further point out that the processed surfaces of the base and lid contain waviness which has an amplitude larger than that of average surface roughness (Ra). Thus, to determine whether a hermetical seal between the base and the lid can be done when contacted, a maximum height (Rz, i.e. a distance between the maximum peak and the lowest valley) between the upper contacting surface and the lower contacting surface is a factor. The Rz of the contact interface will cause a gap created when these surfaces are in contact with each other, which becomes an air flow channel and failure of the hermetical seal between the lid and the base. Moreover, if it is unable to control the surface deflection, the processed surface also will contain a maximum height (Rz) to thereby create the gap, i.e. the air flow channel.

The "flatness" as described in the present invention refers to an offset between a realistic surface of a certain workpiece and an idea plane (true plane). With reference to FIG. 3, a schematic view illustrating a flatness of a surface waviness of a certain workpiece. According to definition of "flatness", a distance (d) between two virtual parallel planes (101 and 102) sandwiching the realistic plane (100) of the workpiece can be represented as the maximum height (Rz) of the realistic plane (100), wherein the upper and lower planes respectively touch the maximum peak and the lowest valley of the realistic plane. The realistic plane (100) is a surface of one workpiece (103) as illustrated, and the surface has surface deflection caused by low frequency factor in actual processing which appears such height difference of quite extent. In addition to that, there exists the surface deflection caused by low frequency factor in actual processing as illustrated in FIG. 4. According to definition of "flatness", a distance (d) between two virtual planes (201 and 202) sandwiching a realistic plane (200) of a workpiece (203) can be referred to, especially the coverage of the realistic plane (200) is defined by an area with a specific length (L) and a width (W), e.g. a 100 mm*100 mm square. It is conceivable that the scale of the area can possibly determine the distance (d) between the two virtue planes (201 and 202), which correspondingly determines the measurement of flatness. Similarly, the distance (d) represents the maximum height (Rz) of the realistic plane (200).

One objective of the present invention is to provide a container for accommodating a substrate. The container includes a base and a lid. The base has a top horizontal surface and at least one first supporting surface surrounding the top horizontal surface. The lid covers the top horizontal surface and engages with the first supporting surface to define an accommodating space for accommodating the substrate. The lid has at least one filtering channel and at least one second supporting surface surrounding the accommodating space. Wherein the second supporting surface is configured to match with the first support surface, the first supporting surface of the base and the second supporting surface of the lid have a consistent slope relatively to that of the top horizontal surface. The first supporting surface of the base and the second supporting surface of the lid both have a flatness less than 0.04 mm to form a hermetical seal when the first supporting surface contacts with the second supporting surface contact.

One more objective of the present invention is to provide a container for accommodating a substrate. The container includes a base and a lid. The base has a top horizontal surface. The lid has at least one filter channel and a storage space. Wherein the lid contacts with the base, the storage space and the top horizontal surface define an accommodating space for accommodating the substrate. At least one contact interface is defined between the lid and base to encircle the top horizontal surface and thereby seal the accommodating space. The contact interface has a gap less than 0.08 mm.

Another objective of the present invention is to provide a container for accommodating a substrate, the container includes a base and a lid. The base has a top horizontal surface and at least one first supporting surface encircling the top horizontal surface. The lid has at least one filter channel, a bottom surface and a flange encircling the bottom surface. The flange has at least one second supporting surface encircling the bottom surface, the second supporting surface at least in part contacts with the first supporting surface of the base such that the bottom surface, the flange and the top horizontal surface define an accommodating space for accommodating the substrate. Wherein the first supporting surface and the second supporting surface have a flatness less than 0.04 mm, which causes a hermetical seal to the accommodating space.

A yet objective of the present invention is to provide a container for accommodating a substrate. The container includes a base and a lid. The base having a top horizontal surface. The lid has at least one filter channel and a storage space. Wherein the lid contacts with the base, the storage space and the top horizontal surface define an accommodating space for accommodating the substrate. At least one contact interface is formed between the lid and the base to encircle the top horizontal surface to thereby seal the accommodating space. Wherein the contact interface has a gap which determines a pressure difference between the accommodating space and an outer space of the container when the filter channel is closed, where the pressure difference is above 100 Pa.

Still one objective of the present invention is to provide a container for accommodating a substrate. The container includes a base and a lid. The base has a top horizontal surface. The lid has at least one filter channel and a storage space. Wherein the lid contacts with the base. The storage space and the top horizontal surface define an accommodating space for accommodating the substrate. At least one contact interface is formed between the lid and the base to encircle the top horizontal surface. Wherein the contact interface has a gap, the accommodating space is vacuumed. During a gas backfill process to an outer space of the container, the gap determines an air flow entering into the container has 90% thereof passing through the filter channel to enter the container.

One further objective of the present invention is to provide a method for controlling air flow entering into a container. The container includes a base having a top horizontal surface and a lid having at least one filter channel. The lid contacts with the base to define an accommodating space. The method includes: forming at least one contact interface between the base and the lid to encircle the accommodating space, the contact interface having a gap; controlling the gap, when the filter channel is closed, to determine a pressure difference between the accommodating space and an outer space of the container above 100 Pa; and performing a gas backfill process to the outer space of the container in which the accommodating space is vacuumed and the filter channel is opened, causing an air flow entering into container with 90% thereof passing through the filter channel.

BRIEF DESCRIPTION OF THE DRAWINGS

The present invention can be understood more thoroughly with reference to the accompanying drawings and the descriptions given below. Various examples, which are not intended to be limiting and exhaustive, will be described with reference to the drawings. The elements shown in the drawings are not necessarily illustrated to actual scale for the purpose of explaining the structures and relevant principles.

DETAILED DESCRIPTION OF THE PREFERRED EMBODIMENTS

A more complete description of the present invention is provided below with reference to the accompanying drawings, and examples are provided to demonstrate exemplary embodiments. Nevertheless, the claimed subject matter of the present invention can be implemented in various forms, and therefore the construction of the covered or claimed subject matters shall not be limited to any exemplary embodiment disclosed in this description; the exemplary embodiments are merely provided as examples. Likewise, the present invention is intended to provide a reasonably broad scope for the claimed or covered subject matters. Besides, for example, a claimed subject matter may be implemented as a method, device, or system. Therefore, a specific embodiment may be in the form of, for example, hardware, software, firmware, or any combination (known to be non-software) thereof.

The term "an embodiment" used in this description does not necessarily refer to exactly the same embodiment, and the term "other (some/certain) embodiments" used in this description does not necessarily refer to different embodiments. The purpose of this description is to explain claimed subject matter using examples that include combinations of all or part of the exemplary embodiments. The term "a contact interface" used in this description shall refer to an interface where "an upper contacting surface" and "a lower contacting surface" contact each other. The upper contacting surface or lower contacting surface discussed in the present invention shall refer to the actual surfaces of a workpiece, not ideal ones. Therefore, the "upper contacting surface" and "lower contacting surface" each has a "flatness" that represents the maximum height (Rz) of the actual surfaces; the "contact interface" may contain an interstice or gap defined by the respective flatness of the "upper contacting surface" and "lower contacting surface."

Figure 5A:
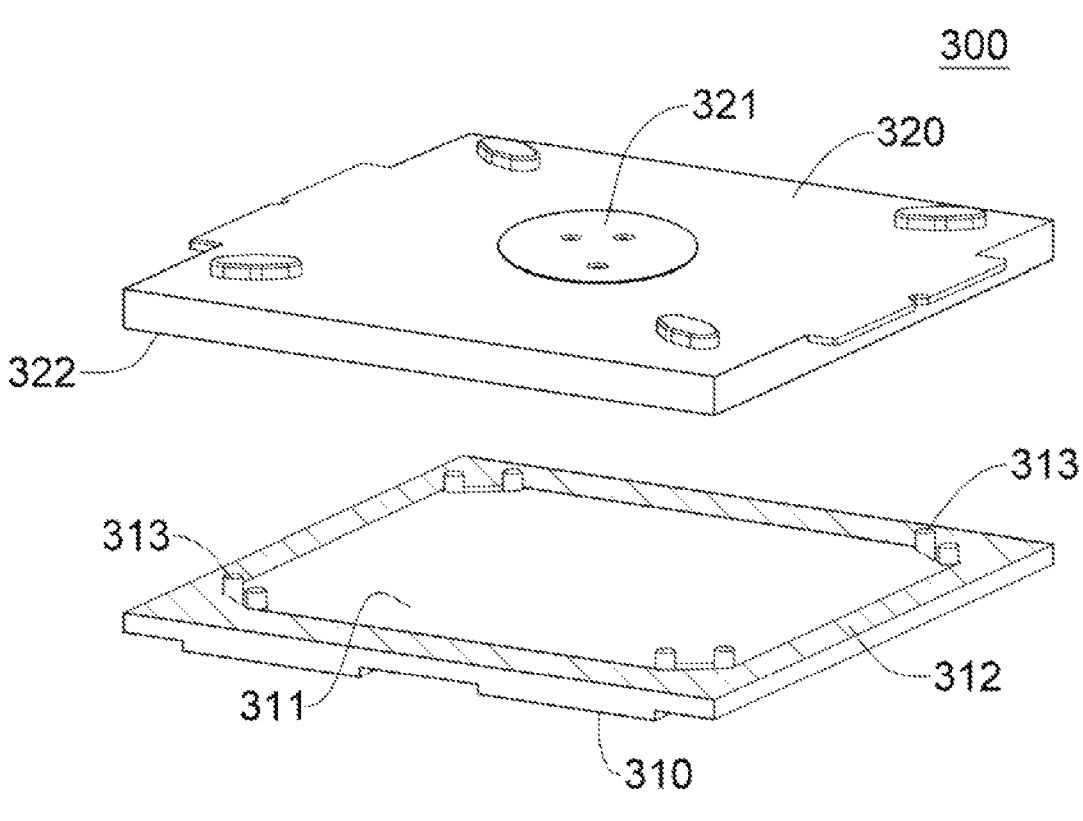
FIG. 5A is an exploded perspective view of a container (e.g., a reticle pod) for accommodating a substrate.

FIG. 5A shows a container (300) for accommodating a substrate; particularly, the container may be a reticle pod. In an embodiment of the present invention, the container (300) is suitable to serve as an inner pod assembly for a reticle pod. The container (300) comprises a base (310) and a lid (320). The base (310) comprises a top horizontal surface (311) and at least one first supporting surface (312) that surrounds the top horizontal surface (311), wherein the top horizontal surface (311) is a flat plane which is suitable for placing a substrate (e.g., a reticle) thereon. The top horizontal surface (311) also includes a plurality of supporting assemblies (313); each supporting assembly (313) has pillars for restricting a side surface of the substrate, and a bump (not shown), which is usually disposed between two pillars, for supporting the bottom surface of the substrate. As shown in FIG. 5A, the first supporting surface (312) is an annular plane adjacent to the periphery of the top horizontal surface (311). The first supporting surface (312) is substantially a continuous upward-facing surface intended to contact a corresponding surface of the lid (320).

The lid (320) comprises a second supporting surface (322), which surrounds the top horizontal surface (311) of the base (310) and engages with the first supporting surface (312). The lid (320) has a receiving space, which, together with the top horizontal surface (311), defines an accommodating space for accommodating the substrate. Methods to achieve the engagement include the contact of upper and lower surfaces, using a bump and groove structure, or having two complementary structures join together. Although other perspectives of the lid (320) are not shown herein, a person skilled in the art could understand that the lid (320) comprises at least an annular part extending downward, to the effect that when the base (310) and the lid (320) are joined together, the downwardly extending annular part of the lid (320) will contact the base (310) and surround the top horizontal surface (311) of the base, while the second supporting surface (322) is the lower surface of the annular part. In an embodiment, the lid (320) may have at least one filter channel (321) and at least one second supporting surface (322) with an annular shape. The second supporting surface (322) is employed to match with the supporting surface (312) of the base (310). The contour of the second supporting surface (322) is substantially consistent with the first supporting surface (312), and the second supporting surface (322) may have an area slightly larger or smaller than that of the first supporting surface (312).

Figure 1:
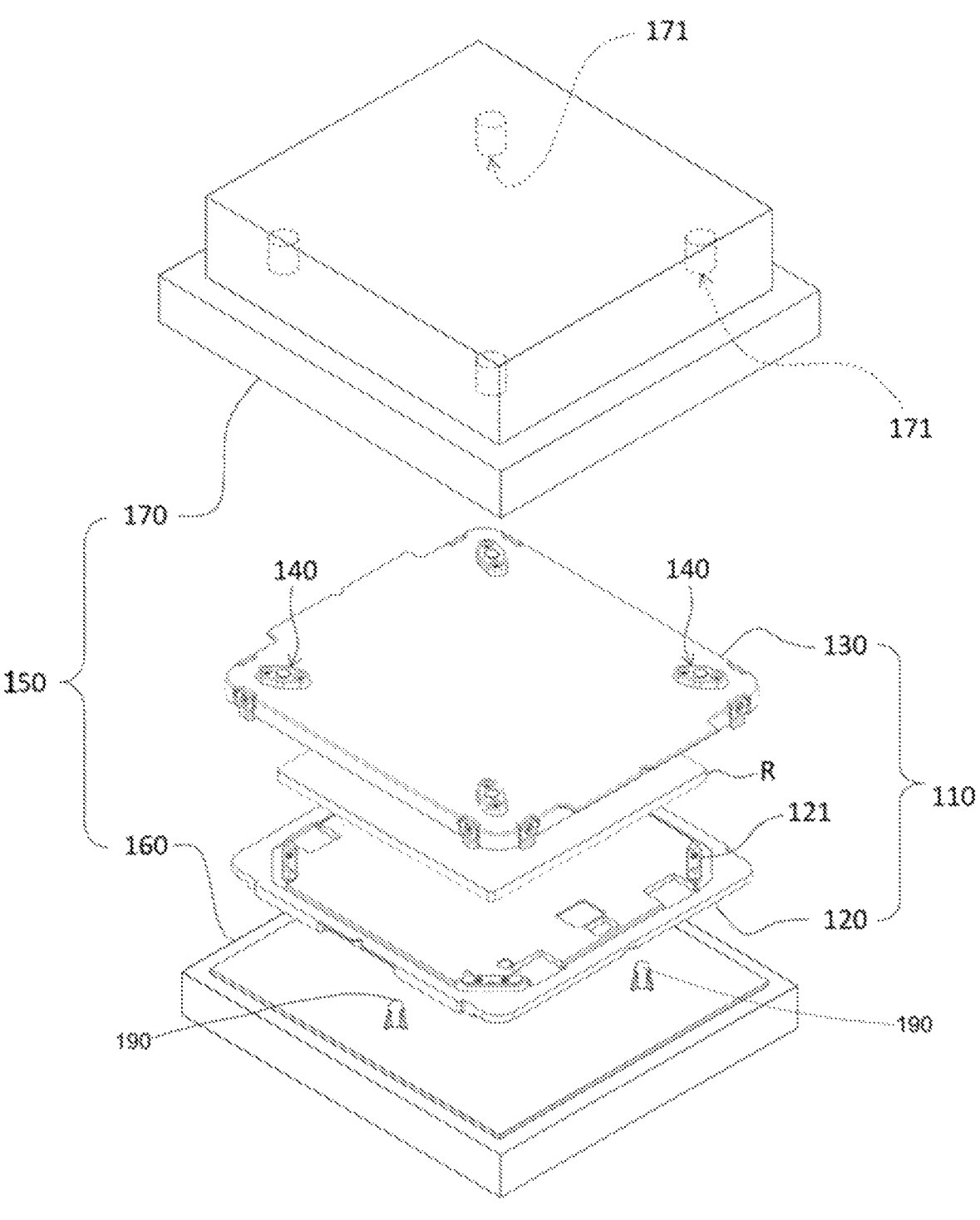
FIG. 1 is an exploded perspective view of a prior art EUV reticle pod.
Figure 2:
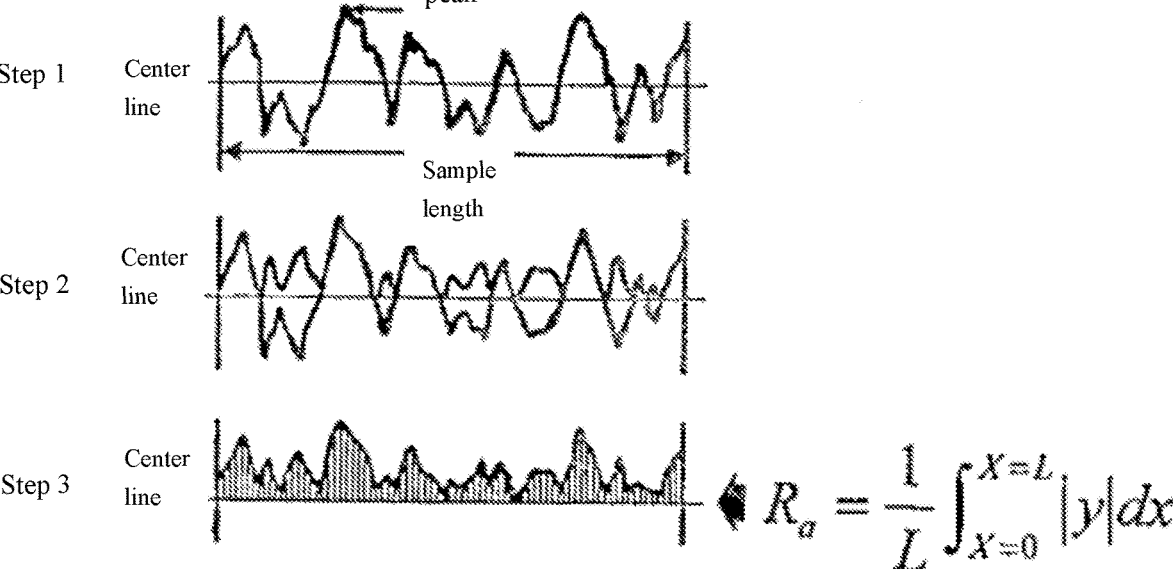
FIG. 2 is a schematic diagram showing the process of obtaining the roughness average (Ra) based on a center line of the roughness curve.
Figure 3:
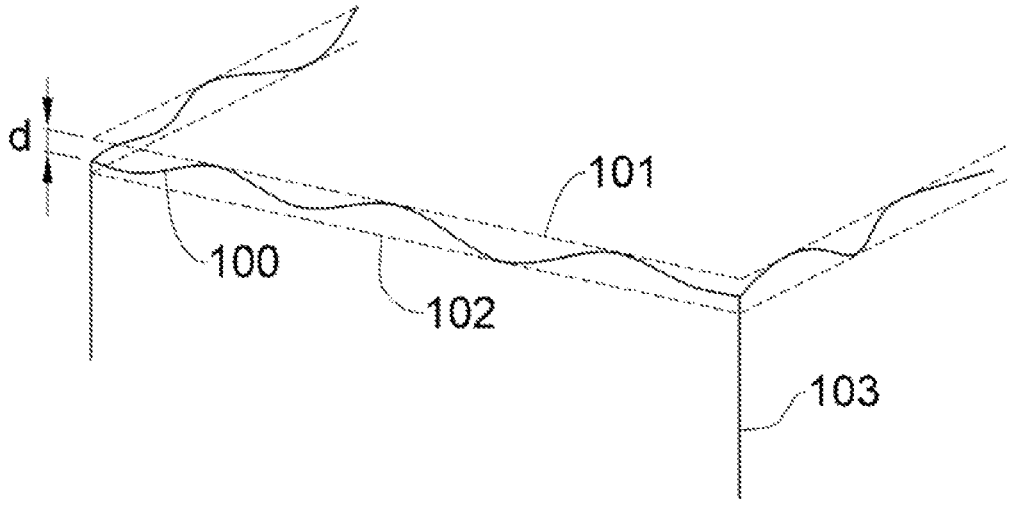
FIG. 3 is a schematic view showing the waviness, which is related to the flatness, in a workpiece surface.
Figure 4:
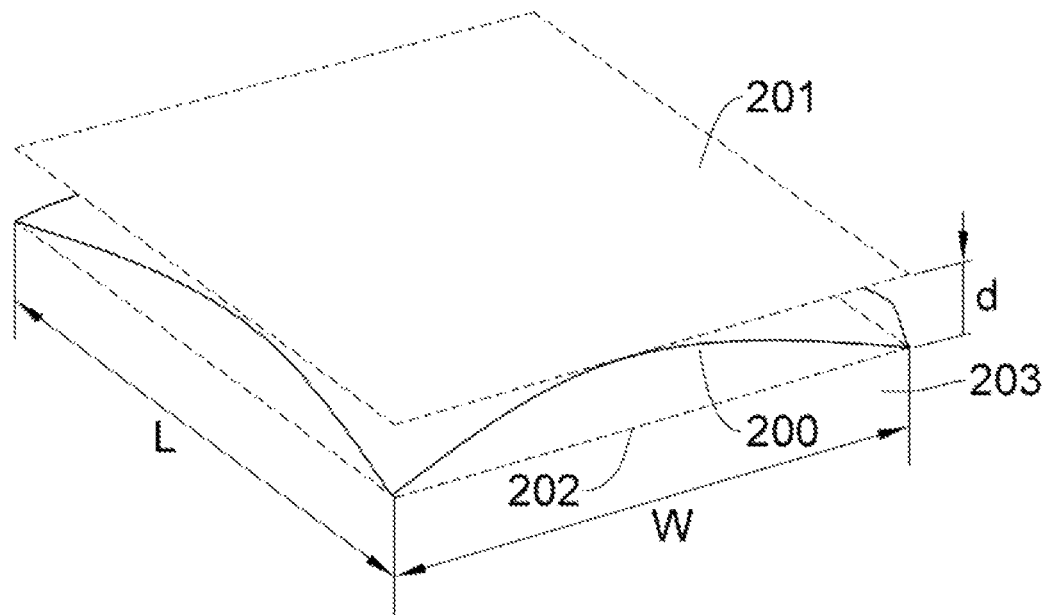
FIG. 4 is a schematic view showing the deflection, which is related to the flatness, in another workpiece surface.
Figure 5B:
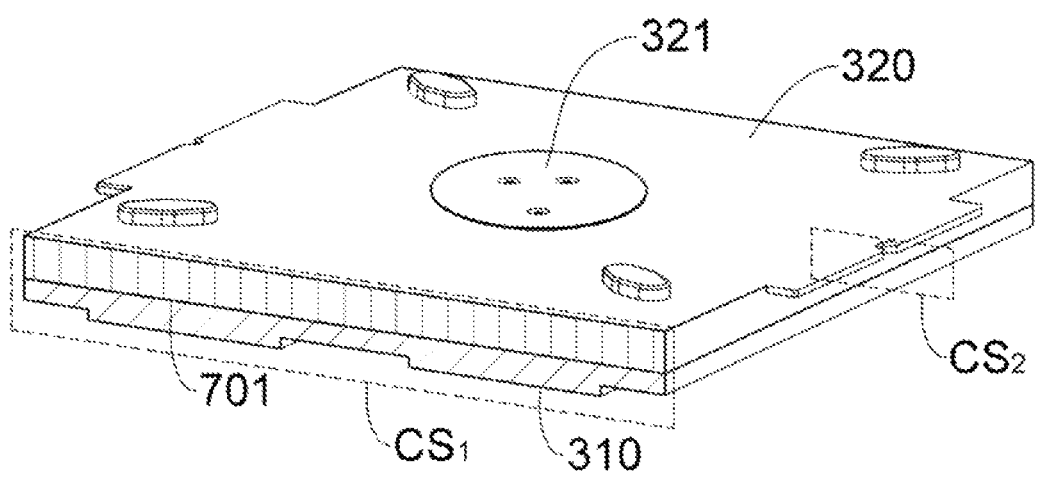
FIG. 5B shows cross-sections at the edges of the container when the lid and the base are joined together.

When the base (310) engages with the lid (320), the first supporting surface (312) and the second supporting surface (322) will contact each other. As shown in FIG. 5B, the base (310) is in contact with the lid (320), and as a cross-section (CS1) along an edge of the container (300) in the figure shows, a contact interface (701) formed between the base (310) and the lid (320) can be seen. Visually speaking, the contact interface (701) demonstrates a straight line. However, as shown in FIG. 4, the low-frequency factors during machining will cause deflection of the first supporting surface (312) of the base (310) and the second supporting surface (322) of the lid (320) respectively. Therefore, the contact interface (701) shown from the view of the cross-section (CS1) may, in fact, not be a perfect straight line. How to achieve effective sealing with a deflected surface will be explained in the following paragraphs. Also, as shown in FIG. 5B, when the container (300) is viewed from another cross-section (CS2) at a different position, other relations between the first supporting surface (312) and second supporting surface (322) can be observed, and the details will be provided in the following paragraphs.

As the cross-section (CS2) in FIG. 5B shows, the first supporting surface (312) of the base (310) and the second supporting surface (322) of the lid (320) can be designed to have different slopes. In one embodiment, the first supporting surface (312) of the base (310) and the second supporting surface (322) of the lid (320) have consistent slopes relative to the top horizontal surface (311). For example, the first supporting surface (312) is a horizontal plane, and the second supporting surface (322) is also a horizontal plane, as shown in FIGS. 6B and 6C. Alternatively, in another embodiment, the first supporting surface (312) is inclined downward in the direction of the top horizontal surface (311), and the second supporting surface (322) is also inclined in the same way, as shown in FIGS. 6D and 6E. In a preferred embodiment of the present invention, in order to achieve effective sealing between the base (310) and the lid (320), the first supporting surface (312) and the second supporting surface (322) each has a flatness that is lower than 0.04 millimeters (mm), so as to form a hermetic seal between the first supporting surface (312) and the second supporting surface (322) when they are in contact. Preferably, the flatness ranges between 1 micron ($\mu$m) and 0.04 mm. The flatness can be measured with a known method, and will not be repeated here.

In the embodiments of the present invention, by controlling the respective flatness of the first supporting surface (312) and the second supporting surface (322), an effective hermetic seal between the base (310) and the lid (320) can be obtained. The better hermetic seal in the contact interface between the base (310) and the lid (320), the greater pressure difference between the inside and outside of the container can be done during gas backfill process in which the container is placed in a vacuum environment with the filter channel closed. Also, with the better hermetic seal, more amount of gas can pass through the filter channel which is opened during gas backfill process. In particular, if the flatness of each supporting surface ranges between 1 $\mu$m and 0.04 mm and an effective hermetic seal between the base (310) and the lid (320) is achieved, when the volume of gas around the container (300) begins to increase from a vacuum state, at least 90% of the incoming gas entering the accommodating space of the container (300) enters through the unclosed filter channel (321) and less than 10% of the incoming gas entering the accommodating space enters through the gap G between the first supporting surface (312) and second supporting surface (322), or through other window gaps, gaps on the lid (320) related to the pressing units, etc. Since other window gaps, and gaps on the lid (320) related to the pressing units are often given sealing rings to enhance hermetic sealing, the less than 10% incoming gas entering the accommodating space enters mainly through the gap G between the first supporting surface (312) and the second supporting surface (322).

Figure 10:
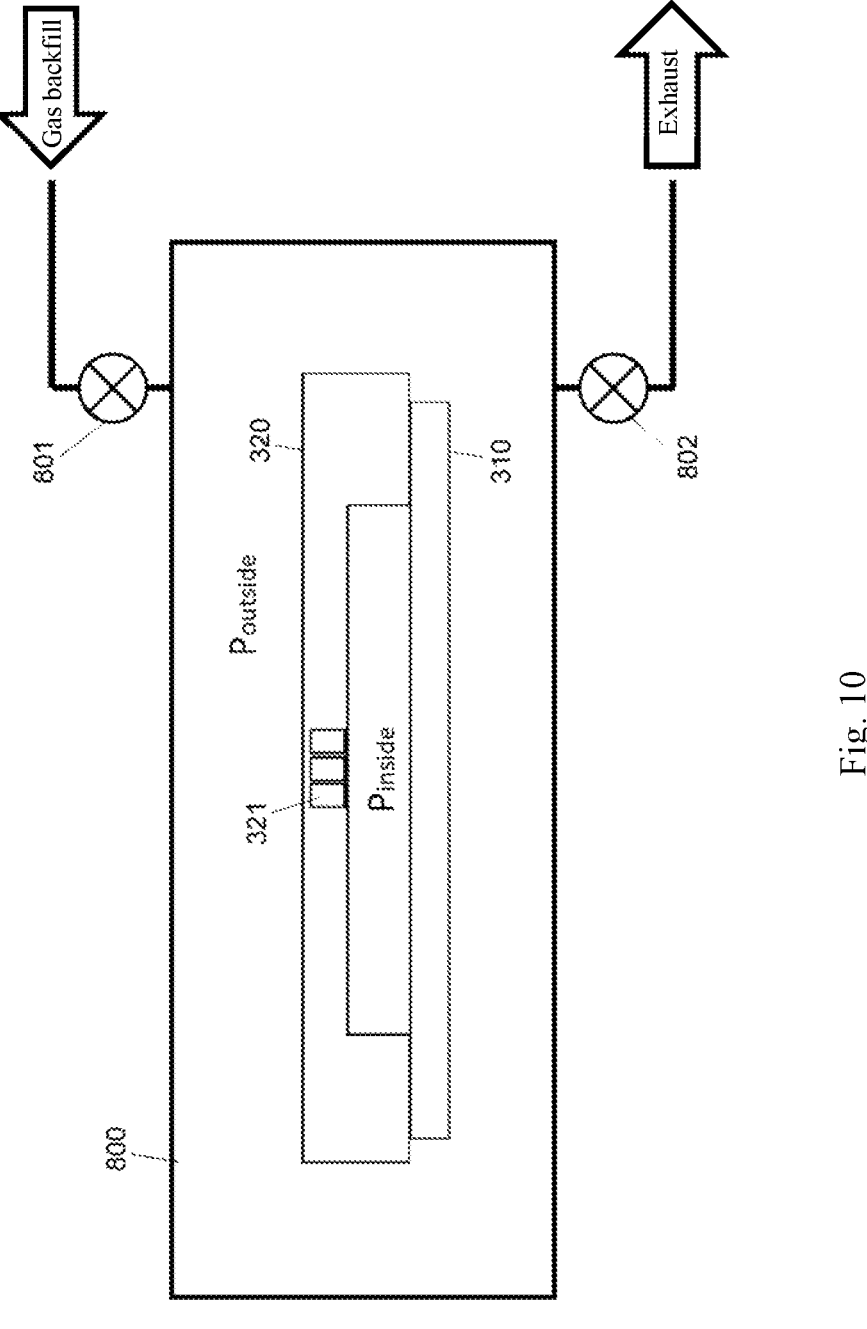
FIG. 10 shows an example as to how the pressure inside and outside the container for accommodating a substrate is tested.

To evaluate if the respective flatness of the first supporting surface (312) and the second supporting surface (322) can allow at least 90% of the incoming gas entering the accommodating space of the container (300) to enter through the unclosed filter channel (321), the present invention hereby provides a testing method, as shown in FIG. 10. A cavity (800), which can be regarded as a cavity within a gas exchange chamber of an EUV exposure machine, is provided. The gas volume within the cavity (800) could start to increase by opening a valve (801) and closing the other valve (802) to control the gas supply. By closing the valve (801) and opening the other valve (802) to control the gas supply, a vacuum within the cavity (800) can be obtained. The testing method of the present invention uses the same vacuum pump/gas increase curve-controlling valves (801, 802) to monitor the difference between the pressure of the accommodating space ($P_{inside}$) of the container (300) and the pressure of the cavity (800) ($P_{outside}$) when the container (300) is placed within the cavity (800). When a vacuum within the accommodating space is obtained and the gas volume in the cavity (800) starts to increase, the pressure $P_{inside}$ is lower than the pressure $P_{outside}$. When a vacuum within the cavity (800) is obtained, the pressure $P_{inside}$ is higher than the pressure $P_{outside}$.

In the case where the filter channel (321) is not closed, when the container (300) of the invention is placed within the cavity (800), the channel (321) will be the major fluid passage for the accommodating space of the container (300). In the case where the filter channel (321) is closed, when the container (300) of the present invention is placed within the cavity (800), the major fluid passage between the accommodating space of the container (300) and the space external to the container (300) will be the gap G between the first supporting surface (312) and second supporting surface (322) as described above. It should be noted that the fluid passages formed around other window gaps and around other interstices of the lid (320) related to the pressing units can be ignored or are considered as controllable and predictable affecting factors. In a testing method provided by the present invention, the container (300) is placed within the cavity (800) with the filter channel (321) unclosed. The same vacuum pump/gas increase curve-controlling valves (801, 802) are used to monitor the difference between the pressure $P_{inside}$ and the pressure $P_{outside}$. The testing method includes determining whether the difference between the pressure $P_{inside}$ and the pressure $P_{outside}$ has reached 100 Pa and above by controlling the pumping out/filling of the gas per second and monitoring the pressure changes. The gas in the cavity (800) is first pumped out to create a vacuum with the pressure $P_{outside}$ reaching 500 Pa. Then, with the base (310) engaged with the lid (320), the gas is backfilled into the cavity (800) again. If more than 100 Pa difference between the pressure $P_{inside}$ and the pressure $P_{outside}$ can be observed, that ensures at least 90% of an airflow entering the accommodating space passing through the unclosed filter channel (321) and less than 10% of the airflow entering the accommodating space passing through the gap (G) between the first supporting surface (312) and second supporting surface (322).

In a preferred embodiment of the present invention, if the flatness of each of the first support surface (312) and the second support surface (322) ranges between 1 $\mu$m and 0.04 mm, when the gas volume within the container (300) begins to increase from a vacuum state, at least 90% of the incoming gas entering the accommodating space can enter through the unclosed filter channel (321), or alternatively, less than 10% of the incoming gas entering the accommodating space can enter through the gap G between the first supporting surface (312) and second supporting surface (322). In a further embodiment of the present invention, preferably, the first supporting surface (312) and the second supporting surface (322) each further has a surface roughness (Sa) ranging between 13 and 100 nm. Such surface roughness can enhance the effective hermetic sealing between the base (310) and the lid (320), and moreover, it can ensure that when the gas volume within the container (300) of the present invention begins to increase from a vacuum state, at least 90%-95% of the incoming gas entering the accommodating space enters through the unclosed filter channel (321), or that alternatively, less than 5%-10% of the incoming gas entering the accommodating space enters through the gap G between the first supporting surface (312) and second supporting surface (322).

It should be understood that in the present invention, the effective hermetic sealing does not mean that no gas will break through the seal formed by the first supporting surface (312) and the second supporting surface (322). Rather, it means that in certain specific environments, the container (300) of present invention can achieve hermetic sealing with the abovementioned conditions in order to meet the requirements of certain processes or equipment.

Figure 6A:
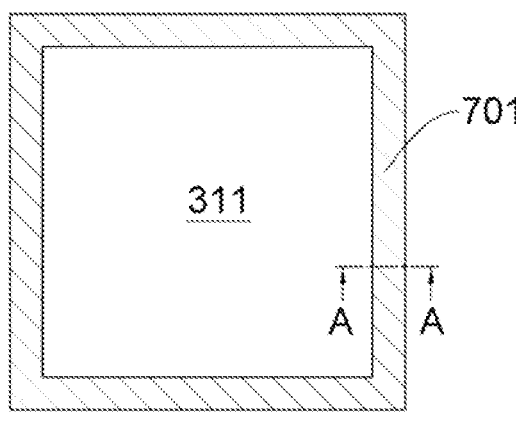
FIG. 6A is a schematic view showing the contact interface between the base and the lid according to one embodiment of the invention.
Figure 6B:
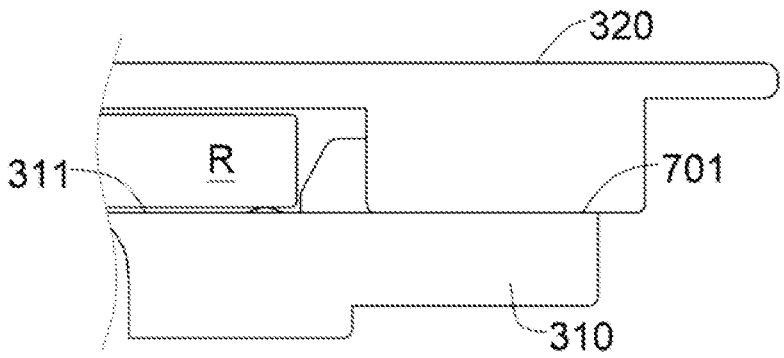
FIGS. 6B to 6E are cross-sectional views showing different examples of the contact interface between the base and the lid along the section line A-A shown in FIG. 6A, based on the embodiment illustrated in FIG. 6A.
Figure 6C:
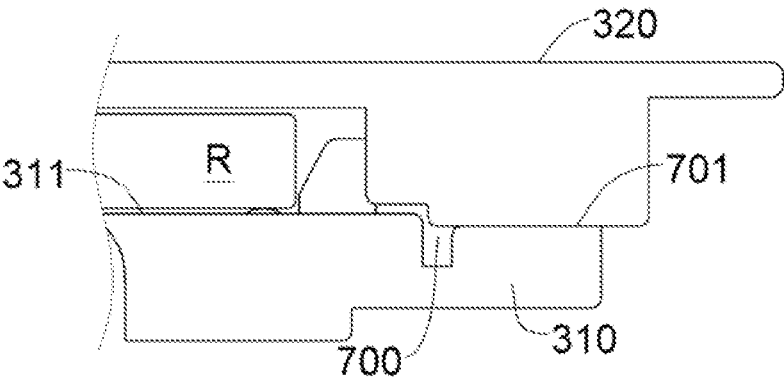
Figure 6D:
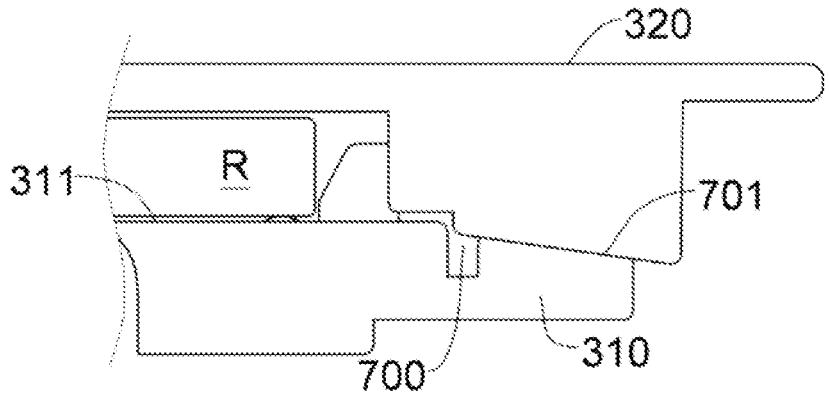
Figure 6E:
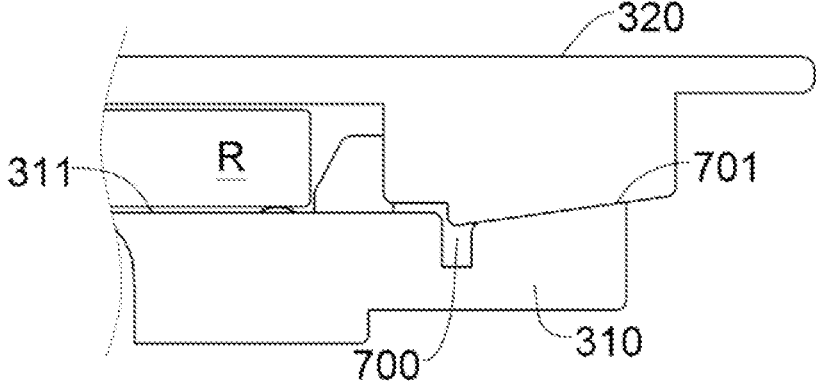

FIG. 6A shows a schematic view of a contact interface between the base and the lid according to an embodiment of the invention. In this embodiment, an annular contact interface (701) is formed between the base (310) and the lid (320) that are shown in FIG. 5A; the contact interface (701) surrounds a top horizontal surface (311) of the base (310), wherein the lower contacting surface (the first supporting surface (312)) and upper contacting surface (the second supporting surface (322)) of the contact interface (701) have the same slope compared with the top horizontal surface (311). The contact interface (701) has a gap G, as shown in the partial enlarged view of FIG. 11B. Preferably, the gap G of the contact interface (701) does not exceed 0.08 mm, and therefore can realize the effective hermetic sealing described in the present invention. In addition, the upper contacting surface and the lower contacting surface of the contact interface (701) each has a surface roughness (Sa) that ranges between 13 and 100 nm and can further enhance the effective hermetic sealing between the base (310) and the lid (320).

FIG. 6B shows a cross-sectional view illustrating the contact interface between the base (310) and the lid (320) along the section line A-A as shown in FIG. 6A. Based on the embodiment illustrated in FIG. 6A, the base (310) of the present invention can have different implementation examples, as shown in FIGS. 6C to 6E. The contact interface (701) may be parallel to the top horizontal surface (311), or inclined compared with the top horizontal surface (311). In one example, the base (310) of the present invention has an annular groove (700) formed surrounding the top horizontal surface (311), so that the annular groove (700) is positioned between the top horizontal surface (311) and the contact interface (701). The groove (700) is used to capture fine dust particles entering the gap G from the space external to the contact interface (701), so that the fine dust particles will fall on the bottom of the groove (700) before reaching the top horizontal surface (311).

Figure 7A:
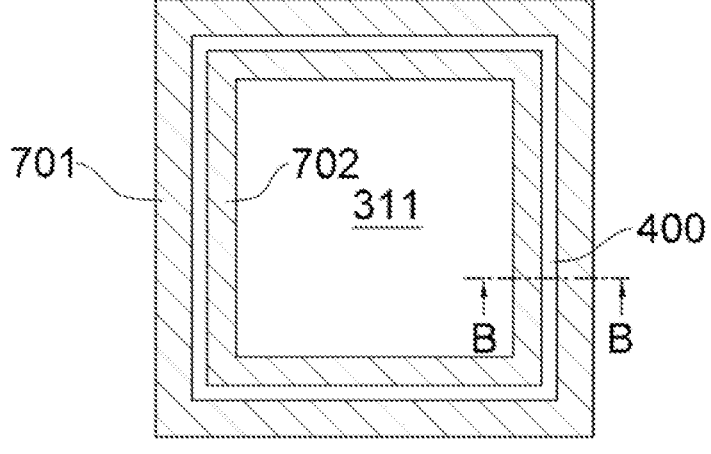
FIG. 7A is a schematic view showing the contact interfaces between the base and the lid according to another embodiment of the invention.
Figure 7B:
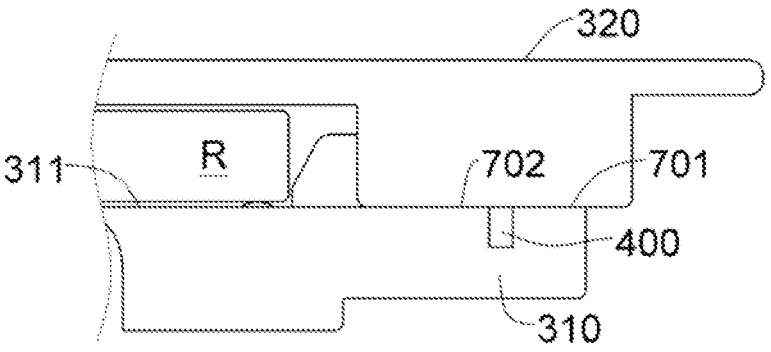
FIGS. 7B to 7D are cross-sectional views showing different examples of the contact interfaces between the base and the lid along the section line B-B shown in FIG. 7A, based on the embodiment illustrated in FIG. 7A.
Figure 7C:
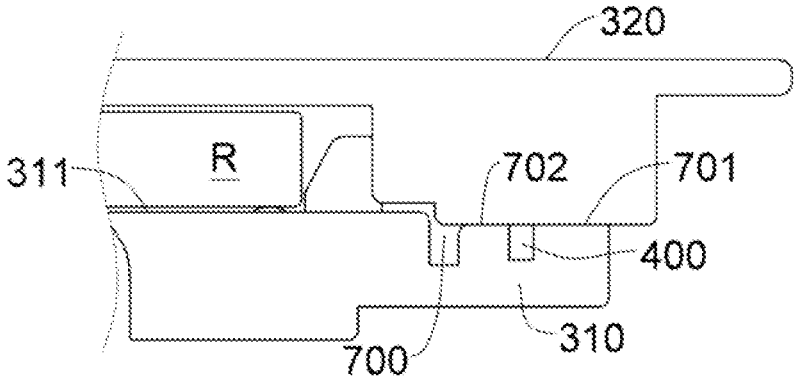
Figure 7D:
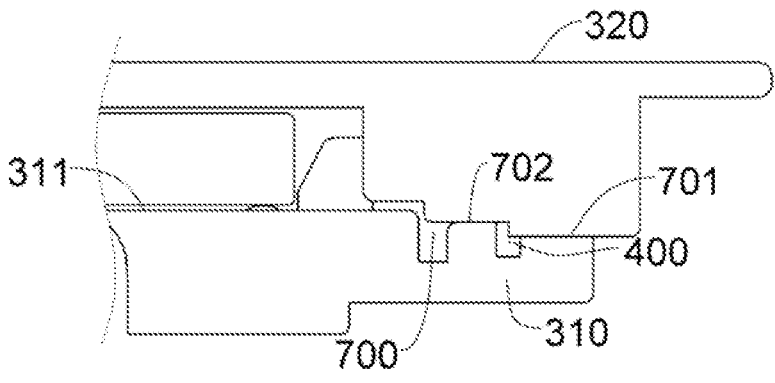

FIG. 7A shows a schematic view of the contact interfaces between the base and the lid according to another embodiment of the invention. In this embodiment, two annular contact interfaces (701, 702) are formed between the base (310) and the lid (320) to surround a top horizontal surface (311) of the base (310), wherein the base (310) has an annular groove (400) formed between the two annular contact interfaces (701, 702). The function and effect of the annular groove (400) are the same as those of the annular groove (700) shown in FIGS. 6C to 6E. Based on the section line B-B shown in FIG. 7A for this embodiment, the base (310) of the present invention can have different implementation examples, as shown in FIGS. 7B to 7D. The lower contacting surface and the upper contacting surface of each of the contact interfaces (701, 702) have the same slope compared with the top horizontal surface (311). For example, as shown in FIG. 7B, the contact interfaces (701, 702) and the top horizontal surface (311) are at the same height; as shown in FIG. 7C, the contact interfaces (701, 702) are at a different height from the top horizontal surface (311), and an annular groove (700) is formed between the contact interface (702) and the top horizontal surface (311) to increase the chance of particle capture; as shown in FIG. 7D, the contact interfaces (701, 702) are at different heights, and an annular groove (700) is formed between the contact interface (702) and the top horizontal surface (311) to increase the chance of particle capture. Preferably, the gap G of at least one of the contact interfaces (701, 702) does not exceed 0.08 mm, so that the effective hermetic sealing according to the present invention can be realized. Furthermore, the upper contacting surface and the lower contacting surface of the contact interfaces (701, 702) each has a surface roughness (Sa) that ranges between 13 and 100 nm and can further enhance the effective hermetic sealing between the base (310) and the lid (320).

Figure 8A:
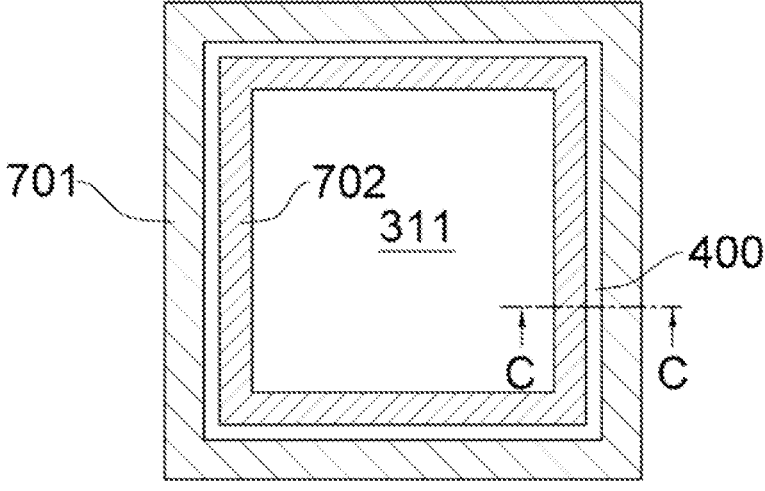
FIG. 8A is a schematic view showing the contact interfaces between the base and the lid according to yet another embodiment of the invention.
Figure 8B:
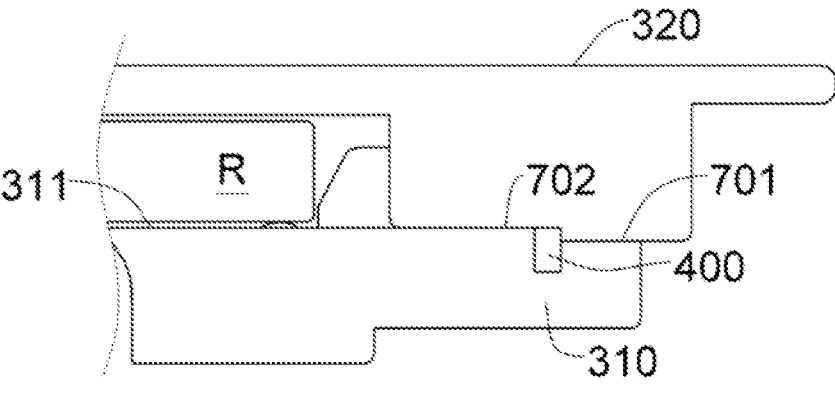
FIGS. 8B to 8D are cross-sectional views showing different examples of the contact interfaces between the base and the lid along the section line C-C shown in FIG. 8A, based on the embodiment illustrated in FIG. 8A.
Figure 8C:
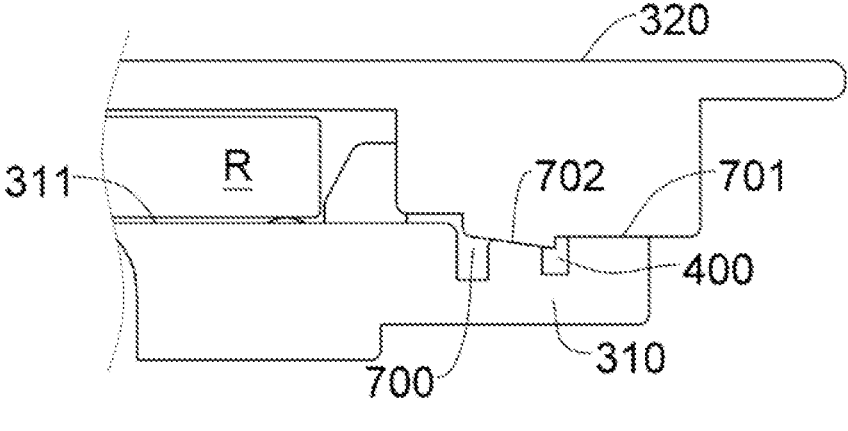
Figure 8D:
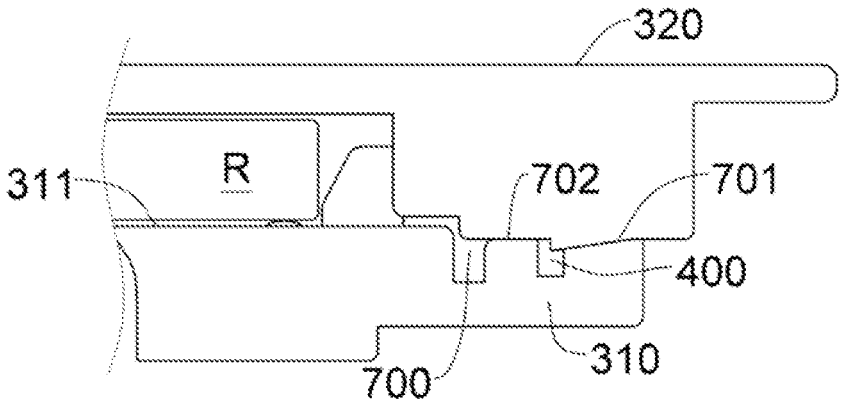

FIG. 8A shows a schematic view of the contact interfaces between the base and the lid according to yet another embodiment of the invention. In this embodiment, two annular contact interfaces (701, 702) are formed between the base (310) and the lid (320) to surround a top horizontal surface (311) of the base (310), wherein the base (310) has an annular groove (400) formed between the two annular contact interfaces (701, 702), which are at different heights from each other. The function and effect of the annular groove (400) are the same as those of the annular groove (700) shown in FIGS. 6C to 6E. Based on the section line C-C shown in FIG. 8A for this embodiment, the base (310) of the present invention can have different implementation examples, as shown in FIGS. 8B to 8D. The lower contacting surface and the upper contacting surface of each of the contact interfaces (701, 702) have the same slope compared with the top horizontal surface (311). For example, as shown in FIG. 8B, the contact interface (702) and the top horizontal surface (311) are at the same height, while the contact interface (701) is parallel to the top horizontal surface (311) and at a different height from it. And as shown in FIG. 8C, the contact interface (701) is parallel to the top horizontal surface (311) and at a different height from it, while the contact interface (702) is inclined compared with the top horizontal surface (311). And further as shown in FIG. 8D, the contact interface (702) and the top horizontal surface (311) are at different heights, while the contact interface (701) is inclined compared with the top horizontal surface (311). Preferably, the gap G of at least one of the contact interfaces (701, 702) does not exceed 0.08 mm, so that the effective hermetic sealing according to the present invention can be realized. Furthermore, the upper contacting surface and the lower contacting surface of the contact interfaces (701, 702) each has a surface roughness (Sa) that ranges between 13 and 100 nm and can further enhance the effective hermetic sealing between the base (310) and the lid (320).

Figure 9A:
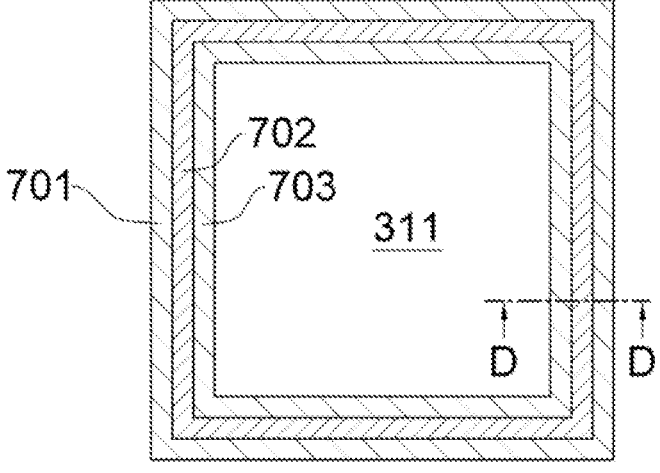
FIG. 9A is a schematic view showing the contact interfaces between the base and the lid according to still another embodiment of the invention.
Figure 9B:
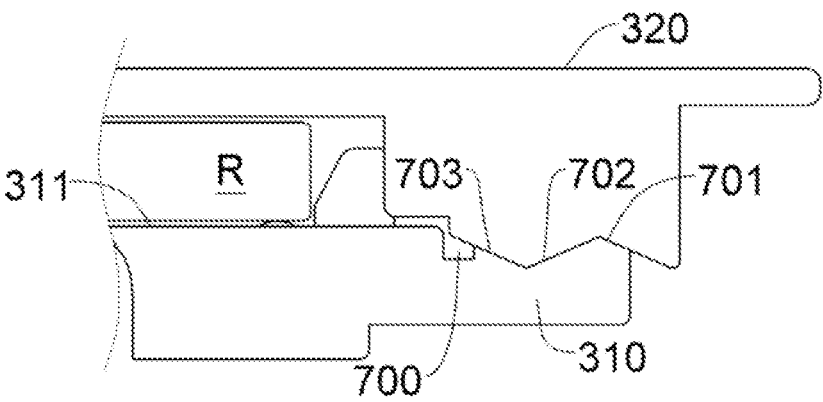
FIG. 9B is a cross-sectional view showing the contact interfaces between the base and the lid along the section line D-D shown in FIG. 9A, based on the embodiment illustrated in FIG. 9A.

FIG. 9A shows a schematic view of the contact interfaces between the base and the lid according to still another embodiment of the invention. In this embodiment, three annular contact interfaces (701, 702, 703), which are continuously adjacent to one another, are formed between the base (310) and the lid (320) to surround a top horizontal surface (311) of the base (310). Based on the section line D-D shown in FIG. 9A for this embodiment, the base (310) can have a structure as shown in FIG. 9B, where the base (310) has an annular groove (700) formed between the top horizontal surface (311) and the contact interface (703) to capture fine dust particles entering the gap G from the space external to the contact interface. Each lower contacting surface and upper contacting surface of the respective contact interfaces (701, 702, 703) has the same slope, with the structures of the lower contacting surface and the upper contacting surface being complementary to each other. Preferably, the gap G of at least one of the contact interfaces (701, 702, 703) does not exceed 0.08 mm, so that the effective hermetic sealing according to the present invention can be realized. Furthermore, the upper contacting surface and the lower contacting surface of the contact interfaces (701, 702, 703) each has a surface roughness (Sa) that ranges between 13 and 100 nm and can further enhance the effective hermetic sealing between the base (310) and the lid (320).

A person having ordinary skill in the art would understand that in the embodiments shown in FIG. 6A through FIG. 9B, the structure of each first supporting surface (312) is adapted to match with that of each second supporting surface (322). In this manner, at least one or more contact interfaces (which can even be at different horizontal levels or heights) can be achieved; moreover, it can ensure that all the first supporting surfaces are in contact with all the second supporting surfaces when the lid is engaged with the base.

Figure 11A:
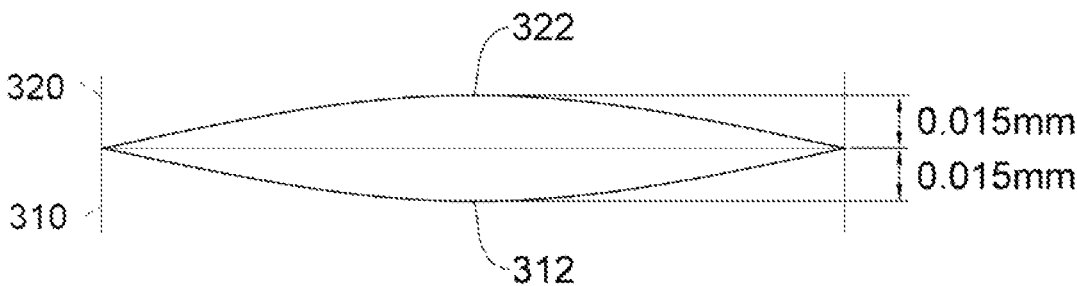
FIG. 11A is a schematic view showing the gap between the contacting surfaces resulting from deflections when the lid and the base are joined together.

FIG. 11A is a schematic view based on the cross section (CS1) shown in FIG. 5B, showing that the base (310) and the lid (320), when joined together, can achieve an effective hermetic seal by choosing a respective proper flatness. As FIG. 11A shows, in an even closer observation, the base (310) and the lid (320) may not be in entire contact with each other due to deflections. That is, the first supporting surface (312) and the second supporting surface (322) may contact each other at the two end points; however, each of them may have a slightly dented portion near the midpoint, which leads to a gap resulted from deflections. According to the embodiments of the present invention, when the first supporting surface (312) and the second supporting surface (322) each has a flatness of 0.015 mm, for example, the base (310) and the lid (320) can still achieve an effective hermetic seal while they are joined together, even if there is a gap between them due to deflections.

Figure 11B:
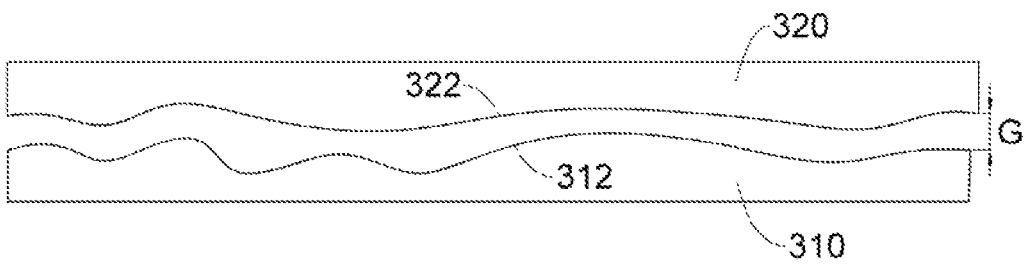
FIG. 11B is a schematic enlarged view of the gap and the related waviness between the lid and the base when they are joined and in contact with each other.
Figure 11C:
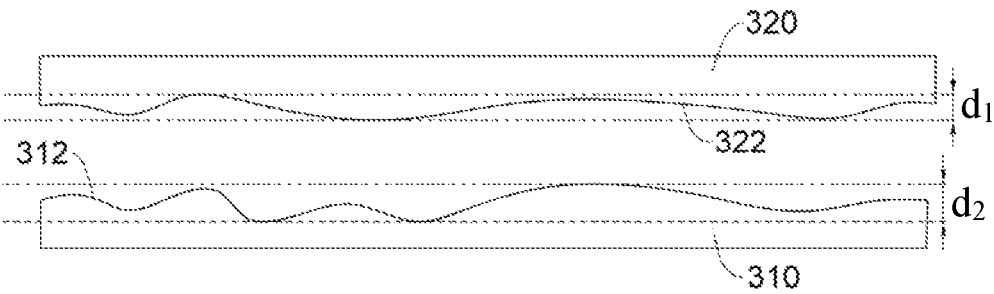
FIG. 11C is a schematic view showing the respective flatness of the first supporting surface of the base and the second supporting surface of the lid (here, the base and lid are not joined together).

FIG. 11B is a partially enlarged schematic view based on the cross section (CS2) shown in FIG. 5B, illustrating the first supporting surface (312) and the second supporting surface (322) when they are in contact. Due to the waviness caused by low-frequency factors during machining, the contact interface between the first supporting surface (312) and the second supporting surface (322) has a gap G. It should be understood that the waviness described above is different from a deflection. The flatness control according to the present invention can achieve an effective hermetic seal even if there is a gap resulted from a waviness or deflection in the container. FIG. 11C is also a schematic view based on the cross section (CS2) shown in FIG. 5B; FIG. 11C illustrates the respective flatness of the first supporting surface (312) of the base (310) and the second supporting surface (322) of the lid (320). The flatness of the first supporting surface (312) of the base (310) is defined as d1, and the flatness of the second supporting surface (322) of the lid (320) is defined as d2. When the base (310) is engaged with the lid (320), the contact interface formed between the first supporting surface (312) and the second supporting surface (322) has a variable gap G, and the gap G is smaller or equals d1+d2. Therefore, in an embodiment of the invention where the respective flatness is 0.04 mm, the gap G will not exceed 0.08 mm, and an effective hermetic seal can be achieved accordingly.

Based on the embodiments described above, it can be seen that a hermetic seal between the base and the lid of the container is achieved simply by the contact between two surfaces, in particular the contact between two metal surfaces; meanwhile, the flatness and/or roughness (Sa) of an involved surface is restricted using the technical means disclosed in the present invention. As such, a hermetic seal formed between relevant surfaces can allow at least 90% of the gas entering the accommodating space of the container to enter through the filter channel of the lid, and less than 10% of the gas to enter through the gap between the contacting surfaces. Such a hermetic seal would be considered effective and successful in certain related manufacturing processes or environments.

What is claimed is:

1. A container for accommodating a substrate, comprising:

a base having a top horizontal surface and at least one first supporting surface surrounding the top horizontal surface; and a lid covering the top horizontal surface and engaging with the first at least one supporting surface to thereby define an accommodating space for accommodating the substrate, the lid having at least one filtering channel and at least one second supporting surface surrounding the accommodating space, wherein the at least one second supporting surface is configured to match with the at least one first supporting surface, the first supporting surface of the base and the at least one second supporting surface of the lid have a consistent slope relative to that of the top horizontal surface, the first supporting surface of the base and the second supporting surface of the lid both have a flatness less than 0.04 mm to thereby form an effective seal when the at least one first supporting surface contacts with the at least one second supporting surface contact, and when the accommodating space is vacuumed with a gas backfill process applied to an outer space of the container to cause an air flow entering to enter into the container, a gap formed between the at least one first supporting surface and the at least one second supporting surface is set such that at least 90% of the air flow passes through the filter channel to enter the accommodating space of the container.

2. The container as claimed in claim 1, wherein a pressure difference is created between the accommodating space and an outer space of the container due to the flatness defined by the at least one first supporting surface and the at least one second supporting surface.

3. The container as claimed in claim 2, wherein the pressure difference is above 100 Pa.

4. The container as claimed in claim 1, wherein when the accommodating space is vacuumed, and during the gas backfill process to the outer space of the container, the effective seal formed by the flatness of the at least one first supporting surface and the at least one second supporting surface causes the air flow entering to enter the container, the flatness is set such that less than 10% of the air flow passes through the gap between the at least one first supporting surface and the at least one second supporting surface to enter the accommodating space of the container.

5. The container as claimed in claim 1, wherein the at least one first supporting surface of the base has a surface roughness (Sa) and the at least one second supporting surface of the lid has a surface roughness, both of said surface roughness of the at least one first supporting surface and the at least one second supporting surface are of a range from 13 to 100 nm.

6. The container as claimed in claim 1, wherein the base has at least two supporting surfaces encircling the top horizontal surface, the at least one first supporting surfaces and the at least one second supporting surface have a consistent slope relatively to the top horizontal surface, and the at least one first supporting surfaces have a largest flatness that is below 0.04 mm.

7. The container as claimed in claim 6, wherein the base has a groove defined by and between the first supporting surfaces encircling the top horizontal surface.

8. The container as claimed in claim 1, wherein the at least one first supporting surface contacts with the at least one second supporting surface to form at least one contact interface therebetween to encircle the top horizontal surface.

9. The container as claimed in claim 8, wherein the contact interface has the gap, and the gap is less than 0.08 mm.

10. The container as claimed in claim 8, wherein the contact interface has a plane that is not at a level identical to or parallel to that of the horizontal surface.

11. The container as claimed in claim 8, wherein the base has at least two first supporting surfaces encircling the top horizontal surface, the at least one first supporting surfaces contact with the at least one second supporting surface to form at least two contact interfaces encircling the top horizontal surface.

12. The container as claimed in claim 11, wherein the base has at least one groove defined between the two contact interfaces and encircling the top horizontal surface.

13. The container as claimed in claim 8, wherein the at least one contact interface has a plane that is not at a level identical to or parallel to that of the top horizontal surface.

14. A container for accommodating a substrate, comprising:
a base having a top horizontal surface; and
a lid having at least one filter channel and a storage space, wherein the lid contacts with the base, the storage space and the top horizontal surface define an accommodating space for accommodating the substrate, at least one contact interface is defined when a bottom surface of the lid directly contacts with a top surface of the base to encircle the top horizontal surface and thereby seal the accommodating space, the at least one contact interface has a gap less than 0.08 mm, and when the accommodating space is vacuumed with a gas backfill process applied to an outer space of the container to cause an air flow entering to enter into the container, the gap is set such that at least 90% of the air flow passes through the filter channel to enter the accommodating space of the container.

15. The container as claimed in claim 14, wherein the top surface of the base defining the at least one contact interface and the bottom surface of the lid defining the at least one contact interface have a flatness less than 0.04 mm.

16. The container as claimed in claim 14, wherein the at least one contact interface has a plane that is not at a level identical to or parallel to that of the top horizontal surface.

17. The container as claimed in claim 14, wherein the lid contacts with the base to define at least two contact interfaces, and the base has at least one groove encircling the top horizontal surface and spacing the at least one contact interfaces and the top horizontal surface.

18. The container as claimed in claim 17, wherein one of the at least two contact interfaces has a plane that is not at a level identical to or parallel to that of the top horizontal surface.

19. The container as claimed in claim 14, wherein a pressure difference is able to be created between the accommodating space and the outer space of the container due to an effective seal formed by the at least one contact interface.

20. The container as claimed in claim 19, wherein the pressure difference is above 100 Pa.

21. The container as claimed in claim 14, wherein when the accommodating space is vacuumed, and during the gas backfill process applied to the outer space of the container, an effective seal formed by the at least one contact interface causes the air flow entering to enter the container, the gap is set such that less than 10% of the air flow passes through the gap of the at least one contact interface to the accommodating space of the container.

22. The container as claimed in claim 14, wherein the top surface of the base defining the at least one contact interface and the bottom surface of the lid defining the at least one contact interface have a surface roughness (Sa) that is of a range from 13 to 100 nm.

23. A container for accommodating a substrate, comprising:
a base having a top horizontal surface and at least one first supporting surface encircling the top horizontal surface; and
a lid having at least one filter channel, a bottom surface and a flange encircling the bottom surface, the flange having at least one second supporting surface encircling the bottom surface, the at least one second supporting surface at least in part contacting with the at least one first supporting surface of the base such that the bottom surface, the flange and the top horizontal surface define an accommodating space for accommodating the substrate, wherein the at least one first supporting surface and the at least one second supporting surface have a flatness less than 0.04 mm, and a gap is formed between the at least one first supporting surface and the second support surface, which causes an effective seal in the accommodating space, and when the accommodating space is vacuumed with a gas backfill process applied to an outer space of the container to cause an air flow entering to enter into the container, the gap is set such that at least 90% of the air flow passes through the filter channel to enter the accommodating space of the container.

24. The container as claimed in claim 23, wherein a pressure difference is created between the accommodating space and the outer space of the container due to the effective seal formed by the flatness of the at least one first supporting surface and the flatness of the at least one second supporting surface.

25. The container as claimed in claim 24, wherein the pressure difference is above 100 Pa.

26. The container as claimed in claim 25, wherein when the accommodating space is vacuumed, and during the gas backfill process to the outer space of the container, the effective seal formed by the flatness of the at least one first supporting surface and the flatness of the at least one second supporting surface causes the air flow entering to enter the container, the flatness is set such that less than 10% of the air flow passes through the gap between the at least one first supporting surface and the at least one second supporting surface to enter the accommodation space of the container.

27. The container as claimed in claim 23, wherein the at least one first supporting surface of the base and the least one second supporting surface of the lid have a surface roughness (Sa) that is of a range from 13 to 100 nm.

28. The container as claimed in claim 23, wherein the at least one first supporting surface and the at least one second supporting surface have a consistent slope relatively to that of the top horizontal surface.

29. The container as claimed in claim 23, wherein the base has at least two first supporting surfaces encircling the top horizontal surface, and the at least one first supporting surfaces have the flatness that is less than 0.04 mm.

30. The container as claimed in claim 29, wherein the base has a groove defined between the at least two first supporting surfaces and encircling the top horizontal surface.

31. The container as claimed in claim 29, wherein at least one of the at least one first supporting surfaces has a plane that is not at a level identical to or parallel to that of the top horizontal surface.

32. The container as claimed in claim 23, wherein the at least one first supporting surface contacts with the at least one second supporting surface to form at least one contact interface encircling the top horizontal surface.

33. The container as claimed in claim 32, wherein the gap is less than 0.08 mm.

34. A container for accommodating a substrate, comprising:

a base having a top horizontal surface and a first supporting surface surrounding the top horizontal surface; and a lid having at least one filter channel, a storage space and a second supporting surface surrounding the storage space;

wherein the first supporting surface of the base and the second supporting surface of the lid both have a flatness less than 0.04 mm;

wherein the lid contacts with the base so that the storage space of the lid and the top horizontal surface of the base define an accommodating space for accommodating the substrate, and at least one contact interface is formed between the first supporting surface and the second supporting surface to encircle the top horizontal surface to thereby seal the accommodating space, wherein the contact interface has a gap which is able to maintain a pressure difference between the accommodating space and an outer space of the container when the filter channel is closed, where the pressure difference is above 100 Pa.

* * * * *